United States Patent
Camillo-Castillo et al.

(10) Patent No.: US 9,608,096 B1
(45) Date of Patent: Mar. 28, 2017

(54) IMPLEMENTING STRESS IN A BIPOLAR JUNCTION TRANSISTOR

(71) Applicant: GLOBALFOUNDRIES INC., Grand Cayman (KY)

(72) Inventors: Renata Camillo-Castillo, Essex Junction, VT (US); Qizhi Liu, Essex Junction, VT (US); Vibhor Jain, Essex Junction, VT (US); James W. Adkisson, Jericho, VT (US); David L. Harame, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/874,039

(22) Filed: Oct. 2, 2015

(51) Int. Cl.
| | |
|---|---|
| *H01L 29/49* | (2006.01) |
| *H01L 29/732* | (2006.01) |
| *H01L 21/762* | (2006.01) |
| *H01L 29/66* | (2006.01) |
| *H01L 21/225* | (2006.01) |
| *H01L 21/02* | (2006.01) |
| *H01L 29/04* | (2006.01) |
| *H01L 29/06* | (2006.01) |

(52) U.S. Cl.
CPC ...... *H01L 29/732* (2013.01); *H01L 21/02595* (2013.01); *H01L 21/02598* (2013.01); *H01L 21/2254* (2013.01); *H01L 21/762* (2013.01); *H01L 29/04* (2013.01); *H01L 29/0642* (2013.01); *H01L 29/66234* (2013.01)

(58) Field of Classification Search
CPC .................... H01L 29/66242; H01L 29/66287
See application file for complete search history.

(56) References Cited

U.S. PATENT DOCUMENTS

| | | | | |
|---|---|---|---|---|
| 5,024,957 A | * | 6/1991 | Harame | ........... H01L 29/66242 148/DIG. 11 |
| 5,599,723 A | * | 2/1997 | Sato | .................. H01L 29/66242 148/DIG. 10 |
| 6,492,238 B1 | | 12/2002 | Ahlgren et al. | |
| 6,597,057 B2 | | 7/2003 | Schuegraf et al. | |
| 6,777,302 B1 | | 8/2004 | Chen et al. | |

(Continued)

OTHER PUBLICATIONS

R.A. Camillo-Castillo, Q.Z. Liu, V. Jain, J. W. Adkisson, M.H. Khater, P. B. Gray, R.K. Leidy, J. J. Pekarik, R. Malladi and D. L. Harame, 2014 Joint International 226th Electrochemical Society Meeting, Cancun, Mexico, Oct. 6, 2016 [Grace Period Disclosure].

(Continued)

*Primary Examiner* — Michael Shingleton
(74) *Attorney, Agent, or Firm* — Thompson Hine LLP; Anthony Canale

(57) ABSTRACT

Device structure and fabrication methods for a bipolar junction transistor. One or more trench isolation regions are formed in a substrate to define a device region having a first width. A protect layer is formed on a top surface of the one or more trench isolation regions and a top surface of the device region. An opening is formed in the protect layer. The opening is coincides with the top surface of the first device region and has a second width that is less than or equal to the first width of the first device region. A base layer is formed that has a first section on the device region inside the first opening and a second section on the protect layer.

19 Claims, 4 Drawing Sheets

(56) References Cited

U.S. PATENT DOCUMENTS

| | | | |
|---|---|---|---|
| 6,900,519 B2 | 5/2005 | Cantell et al. | |
| 7,102,205 B2 | 9/2006 | Chidambarrao et al. | |
| 7,786,510 B2 | 8/2010 | Shim et al. | |
| 7,888,745 B2 | 2/2011 | Khater et al. | |
| 2007/0023864 A1* | 2/2007 | Khater | H01L 29/7378 257/565 |
| 2007/0166939 A1* | 7/2007 | Yang | H01L 29/66287 438/309 |
| 2013/0119442 A1* | 5/2013 | Chan | H01L 27/0623 257/256 |
| 2013/0187198 A1* | 7/2013 | Camillo-Castillo | H01L 29/417 257/197 |

OTHER PUBLICATIONS

Scott T. Dunham, Milan Diebel and Chihak Ahn, Chen Luen Shih, Calculations of effect of anisotropic stress/strain on dopant diffusion in silicon under equilibrium and nonequilibrium conditions, J. Vac. Sci. Technol. B 24(1), Jan./Feb. 2006, Jan. 27, 2006.

Thanh Viet Dinh, Sung-Min Hong, Christoph Jungemann, Improving the high-frequency performance of SiGe HBTs by a global additional uniaxial stress, 5th International SiGe Technology and Devices Meeting (ISTDM 2010). Solid-State Electronics, vol. 60, Issue 1, Jun. 2011, pp. 58-64.

M. Al-Sa'di, S. Fregonese, C. Maneux, and T. Zimmer, Abstract #1873, 218th ECS Meeting, 2010 The Electrochemical Society, Modeling of NPN-SiGe-HBT Electrical Performance Improvement through Si3N4 Strain in the Collector Region.

Renata A. Camillo-Castillo, Qizhi Z. Liu, Vibhor Jain, James W. Adkisson, Marwan H. Khater, Peter Gray, John Jack Pekarik, R Malladi, and D. L. Harame, A Novel Approach to Isolating the Edge of the Shallow Trench Isolation in SiGe HBTs for Improved Device Performance ECS Trans. Aug. 6, 2014 64(6): pp. 53-63. [Grace Period Disclosure].

* cited by examiner

IMPLEMENTING STRESS IN A BIPOLAR JUNCTION TRANSISTOR

BACKGROUND

The invention relates generally to semiconductor devices and integrated circuit fabrication and, in particular, to fabrication methods and device structures for bipolar junction transistors and heterojunction bipolar transistors.

Bipolar junction transistors may be found, among other end uses, in RF transceivers, multi-gigabit analog-to-digital converters, optical networks, automotive radar, and high-speed circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Bipolar junction transistors are three-terminal electronic devices that include an emitter, an intrinsic base, and a collector defined by regions of different semiconductor materials. In the device structure, the intrinsic base situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

A heterojunction bipolar transistor is a variety of bipolar junction transistor in which two or more of the terminals-emitter, intrinsic base, and/or collector—are composed of semiconductor materials with unequal band gaps, which creates heterojunctions. For example, the base of a heterojunction bipolar transistor may be composed of silicon germanium (SiGe), which is characterized by a narrower band gap than silicon.

Device performance may be improved by thinning the layers of semiconductor material used to form the terminals, optimizing the germanium concentration profile across the thickness of the layer forming the base, adding carbon to the semiconductor layer forming the base in order to reduce the diffusion of the electrically-active dopant, and reducing the number of thermal cycles to minimize diffusion. Despite these measures, improved fabrication methods and device structures are needed for bipolar junction transistors and heterojunction bipolar transistors.

SUMMARY

In an embodiment of the invention, a method is provided for fabricating a device structure. One or more trench isolation regions are formed in a substrate to define a device region having a first width. A protect layer is formed on a top surface of the one or more trench isolation regions and a top surface of the device region. An opening is formed in the protect layer. The opening coincides with the top surface of the first device region and has a second width that is less than or equal to the first width of the first device region. A base layer is formed that has a first section on the device region inside the first opening and a second section on the protect layer.

In an embodiment of the invention, a device structure includes one or more trench isolation regions in a substrate. The one or more trench isolation regions define a device region in the substrate. The device structure includes a protect layer on a top surface of the one or more trench isolation regions and a top surface of the device region. The protect layer includes an opening that coincides with the top surface of the device region. The opening in the protect layer has a second width that is less than or equal to a first width of the device region. A base layer includes a first section on the device region inside the opening and a second section on the protect layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1A:
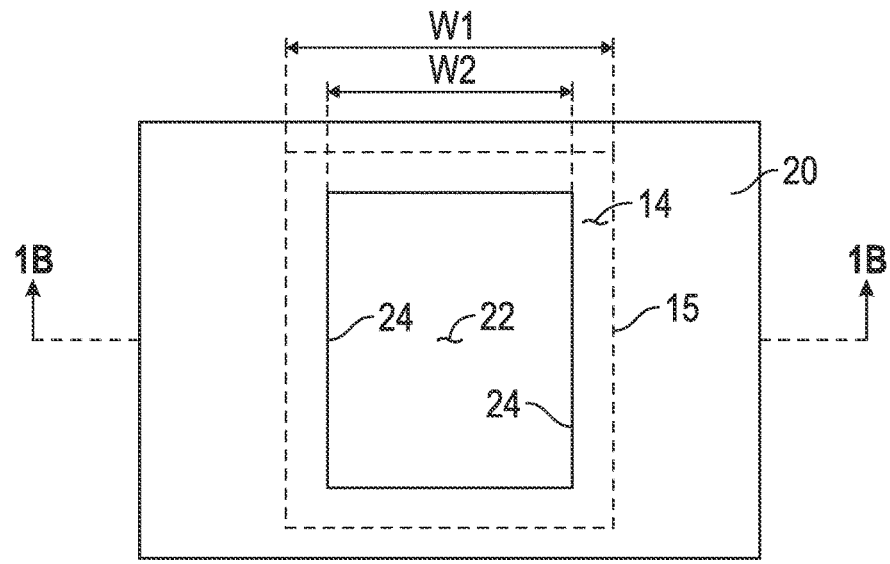
FIG. 1A is a top view of a portion of a substrate at an initial fabrication stage of a processing method for fabricating a device structure in accordance with an embodiment of the invention.
Figure 1B:
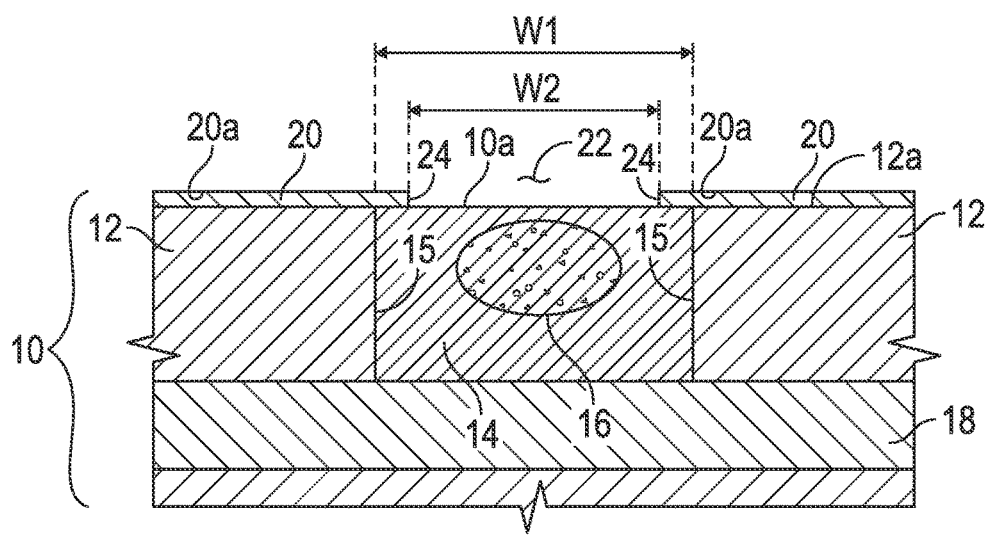
FIG. 1B is a cross-sectional view taken generally along line 1A-1A in FIG. 1.

With reference to FIGS. 1A, 1B and in accordance with an embodiment of the invention, a substrate 10 comprises a single-crystal semiconductor material usable to form the devices of an integrated circuit. The semiconductor material constituting the substrate 10 may include an epitaxial layer at its top surface 10a, which may contain an amount of an electrically-active dopant that enhances its electrical properties relative to the remainder of the substrate 10. For example, the substrate 10 may include an epitaxial layer of single crystal silicon that is doped with a concentration of, in a construction for an NPN transistor, an n-type dopant from Group V of the Periodic Table (e.g., phosphorus (P), arsenic (As), or antimony (Sb)) in a concentration effective to impart n-type conductivity.

Trench isolation regions 12 are located in the semiconductor material of the substrate 10. The trench isolation regions 12 extend from the top surface 10a of the substrate 10 to a shallow depth beneath the top surface 10a. The trench isolation regions 12 may be formed by depositing a hardmask, patterning the hardmask and substrate 10 with lithography and etching processes to define trenches, depositing an electrical insulator to fill the trenches, planarizing the electrical insulator relative to the hardmask using a chemical mechanical polishing (CMP) process, and removing the hardmask. In one embodiment, the trench isolation regions 12 may be comprised of silicon dioxide (SiO$_2$) deposited by chemical vapor phase deposition (CVD).

A device region 14 used in fabricating a device structure is located between the trench isolation regions 12. The device region 14 adjoins the trench isolation regions 12 at interfaces 15, which may be vertically oriented relative to the top surface 10a. The device region 14 has a width W1 and a length that are determined by the arrangement of the trench isolation regions 12 and that may be measured as distances between the opposite interfaces 15 with the trench isolation regions 12. The device region 14 is comprised of a portion of the semiconductor material of the substrate 10. The device region 14 also has a vertical dimension or height in a direction normal to a plane containing its length and width that is established by the depth relative to its top surface 10a that the trench isolation regions 12 penetrate into the substrate 10.

A collector 16 may be comprised of a section or all of the material of the device region 14 located between the trench isolation regions 12. The collector 16 may contain a concentration of an n-type dopant in a concentration that is effective to impart n-type conductivity to its semiconductor material. A subcollector 18 may extend laterally in the substrate 10 beneath the trench isolation regions 12 in order to couple the collector 16 of the device region 14 with a collector contact region.

A protect layer 20 is deposited on a top surface of the substrate 10, which includes a top surface 12a of the trench isolation regions 12 and a top surface of the device region 14. The protect layer 20 may be comprised of a polycrystalline semiconductor material, such as polycrystalline silicon (i.e., polysilicon), deposited by chemical vapor deposition. Alternatively, the protect layer 20 may be comprised of a dielectric material, such as silicon dioxide or silicon nitride deposited by chemical vapor deposition, or a combination of a dielectric material with a semiconductor material, such as polysilicon. In a specific embodiment, the protect layer 20 may include a layer of polysilicon on a layer of silicon nitride. The protect layer 20 may be used to protect a different device region on the substrate 10 when the device region 14 is being processed to fabricate the device structure 25. For example, the protect layer 20 may be used to protect CMOS field effect transistors in other device regions while the device structure is being fabricated using device region 14.

The protect layer 20 is opened by patterning to introduce an opening 22 that extends through it full thickness to the device region 14 at the top surface 10a of the substrate 10. The surface area of the device region 14 opened through the opening 22 may be used to subsequently form the base and emitter of a device structure. The opening 22 in the protect layer 20 is laterally arranged in a plane including the length and width of the device region 14 to be in alignment with the device region 14. The opening 22 is closed geometrically by edges 24 of the protection layer 20, and is adjusted in size so that the protect layer 20 completely covers the trench isolation regions 12 at least in the width dimension. The edges 24 of the opening 22 are aligned relative to the nearby edges of the trench isolation regions 12, which are located at the interfaces 15. The opening 22 has a width W2 between opposite edges 24 that is less than or equal to the width of the device region 14 at its interfaces 15 with the trench isolation regions 12. In the representative embodiment, the width of the opening 22 in the protect layer 20 is less than or equal to the width of the device region 14. In an alternative embodiment, the width of the opening 22 in the protect layer 20 may be equal to the width of the device region 14.

The opening 22 also has a length that is transverse to its width, and that is greater than its width such that the opened area is rectangular. The length of the opening 22 in the protect layer 20 may be less than or equal to the length of the device region 14. As a result, the open area of the opening 22 inside the edges 24 may be less than or equal to the surface area of the device region 14 at the top surface 10a of the substrate 10. A bipolar junction transistor or a heterojunction bipolar transistor is formed within the opening 22 using the device region 14.

The opening 22, which coincides with the top surface of the device region 14, may be formed by applying a mask layer to the top surface 10a of the substrate 10. The mask layer may comprise, for example, a photoresist that is applied with a spin coating process, pre-baked, exposed to a radiation projected through a photomask, baked after exposure, and developed with a chemical developer to define a pattern with an opening at the intended location of the opening 22. An etching process may be used to remove the unmasked dielectric material of the protect layer 20 to define the opening 22. The etching process may comprise a wet chemical etch or a dry etch, and may rely on a given etch chemistry that removes the dielectric material of the protect layer 20 selective to (i.e., at a higher rate than) the semiconductor material of the device region 14.

The protect layer 20 may promote the integration of features of bipolar junction transistors or heterojunction bipolar transistors into a complementary metal-oxide-semiconductor (CMOS) process before the manufacture of the field-effect transistors is completed. The fabrication of the field-effect transistors may be paused after gate formation and before formation of the source and drain regions, and the field-effect transistors are covered with the protect layer 20 during the processing of the device structures. After the bipolar junction transistors or heterojunction bipolar transistors are processed, the protect layer 20 is subsequently removed and the fabrication of the field-effect transistors is completed. In accordance with the embodiments of the invention, the layout of the protect layer 20 may be utilized to improve the intrinsic device characteristics for the heterojunction bipolar transistors instead of merely being removed after serving to isolate the underlying field-effect transistors on the wafer while processing the bipolar junction transistors or heterojunction bipolar transistors.

Figure 2:
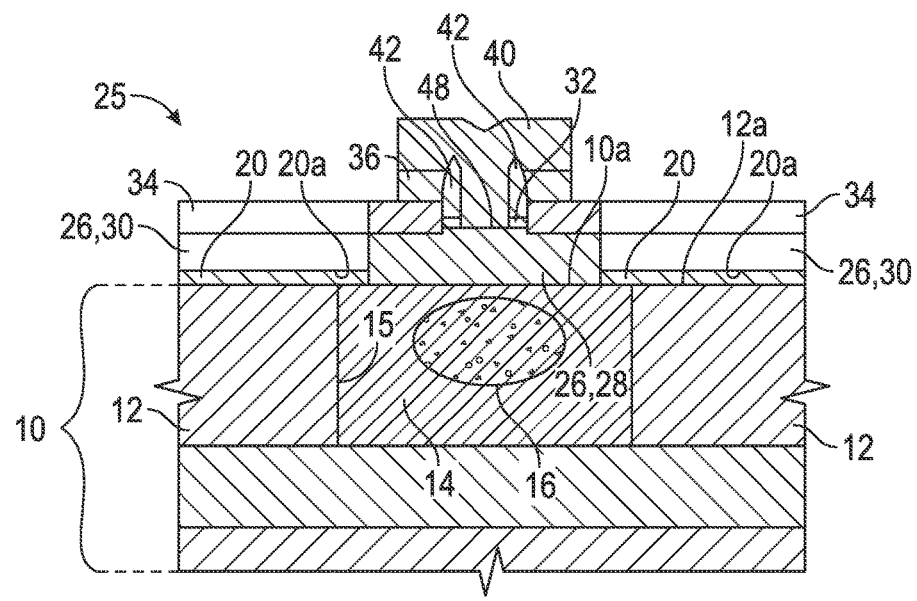
FIG. 2 is a cross-sectional view similar to FIG. 1B at a subsequent fabrication stage of the processing method.

With reference to FIG. 2 in which like reference numerals refer to like features in FIG. 1 and at a subsequent fabrication stage of the processing method, the remainder of a device structure 25 for a bipolar junction transistor or a heterojunction bipolar transistor is then fabricated using the device region 14 and the protect layer 20. An intrinsic base layer 26 of a given thickness is located on the top surface 10a of substrate 10 in the device region 14 and on a top surface 20a of the protect layer 20. The intrinsic base layer 26 may include a single crystal section 28 positioned in vertical alignment with the device region 14 and that directly contacts the single crystal semiconductor material of the device region 14. The intrinsic base layer 26 may further include a polycrystalline section 30 that adjoins the single crystal section 28.

The intrinsic base layer 26 may be comprised of a different semiconductor material than the device region 14 and may have an opposite conductivity type from the collector 16. For example, the intrinsic base layer 26 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the intrinsic base layer 26 may be uniform across the thickness of intrinsic base layer 26 or graded and/or stepped across the thickness of intrinsic base layer 26. The semiconductor material of the intrinsic base layer 26 may comprise a dopant, such as a p-type dopant selected from Group III of the Periodic Table (e.g., boron) in a concentration that is effective to impart p-type conductivity and, optionally, carbon (C) to suppress the diffusion of the p-type dopant.

The intrinsic base layer 26 may be formed on a top surface of the device region 14 inside the opening 22 from a semiconductor material layer deposited using a low temperature epitaxial (LTE) growth process, such as vapor phase epitaxy (VPE). Single crystal semiconductor material (e.g., single crystal silicon and/or single crystal SiGe) epitaxially grows in the single crystal section 28, which is disposed on the device region 14. The crystal structure of the single crystal semiconductor material of the device region 14 serves as a crystalline template for the epitaxial growth of the crystal structure of the single crystal section 28 of the intrinsic base layer 26. A polycrystalline section 30 of the intrinsic base layer 26 is formed on the top surface 20a of the protect layer 20, which lacks that ability to serve as a crystalline template for epitaxial growth. The polycrystalline section 30 may be comprised of polycrystalline semiconductor material, such as polycrystalline silicon or polycrystalline SiGe.

The single crystal section 28 of the intrinsic base layer 26 defines an intrinsic base that participates in forming an emitter-base junction. The single crystal section 28 of the intrinsic base layer 26 has a width that is equal to the width of the opening 22. The single crystal section 28 of the intrinsic base layer 26 also has a length that is transverse to its width, and that is greater than its width.

The opening 22 in the protect layer 20 operates to establish the boundaries for the transition in the crystal structure for the intrinsic base layer 26 from the single crystal semiconductor material of the single crystal section 28 to the polycrystalline semiconductor material of the polycrystalline section 30. The reduced width of the opening 22 of the protect layer 20 relative to the width of the device region 14 and in comparison with opening width in conventional constructions causes the polycrystalline section 30 of the intrinsic base layer 26 to extend inward to a location overlying the device region 14. The single crystal section 28 of the intrinsic base layer 26 terminates at a position nominally coinciding with (i.e., coterminous with) the position of the edges 24 of the opening 22 in the protect layer 20.

A dielectric layer is deposited and patterned to form a pad 32 on the single crystal section 28 of the intrinsic base layer 26. The pad 32 is patterned when an emitter opening is formed to expose the single crystal section 28 of the intrinsic base layer 26

An extrinsic base layer 34 is deposited on the intrinsic base layer 26. The extrinsic base layer 34 may be comprised of polycrystalline semiconductor material, such as polycrystalline silicon, formed by chemical vapor deposition. The semiconductor material of the extrinsic base layer 34 may comprise a dopant, such as a p-type dopant selected from Group III of the Periodic Table (e.g., boron or phosphorus) in a concentration that is effective to impart p-type conductivity and, optionally, carbon (C) to suppress the diffusion of the p-type dopant. The dielectric layer 36 may be comprised of an electrical insulator, such as silicon nitride ($Si_3N_4$) or silicon dioxide ($SiO_2$) deposited using chemical vapor deposition.

The thickness of the extrinsic base layer 34 on the protect layer 20 is additive to the thickness of the polycrystalline section 30 of the intrinsic base layer 26. The opening 22 in the protect layer 20 operates to establish the boundaries at which the crystal structure for the intrinsic base layer 26 and the extrinsic base layer 34 transition from single crystal semiconductor material to polycrystalline semiconductor material. The reduced dimensions (width and length) of the opening 22 of the protect layer 20 relative to the dimensions (width and length) of the device region 14 causes the polycrystalline semiconductor material to overlie the device region 14 in addition to the trench isolation regions 12. The polycrystalline semiconductor material has a significantly enhanced thickness due to the presence of the polycrystalline semiconductor material of the protect layer 20 at the time of deposition/growth of base layers 26, 34 and in comparison to the growth of polycrystalline semiconductor material that would occur if nucleated on the trench isolation regions 12 instead of the overlying protect layer 20.

A dielectric layer 36 is deposited on the extrinsic base layer 34. The dielectric layer 36 may be comprised of an electrical insulator, such as silicon nitride ($Si_3N_4$) or silicon dioxide ($SiO_2$) deposited using chemical vapor deposition. The dielectric layer 36 may be patterned with the emitter opening is formed and/or when the emitter is formed.

An emitter 40 is located in the emitter opening that extends through the dielectric layer 36, the extrinsic base layer 34, and the pad 32 to the intrinsic base layer 26. Non-conductive spacers 42 clad the emitter opening and are formed before the emitter 40 is formed. The non-conductive spacers 42 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces. The emitter opening, which is aligned with the single crystal section 28 of the intrinsic base layer 26, may be formed by patterning with photolithography and etching processes. The single crystal section 28 of the intrinsic base layer 26 is located vertically between the emitter 40 and the collector 16.

The emitter 40 has a width, W3, that is aligned parallel to the widths of the opening 22 and the device region 14. The emitter 40 also has a length that is transverse to its width, and that is greater than its width. The emitter 40 may be formed from a layer of semiconductor material that is deposited and then itself patterned using lithography and etching processes. The emitter 40 may be comprised of a heavily-doped semiconductor material that is deposited and then patterned using lithography and etching processes. For example, the emitter 40 may be comprised of polysilicon or polycrystalline silicon-germanium deposited by CVD or LPCVD and heavily doped with a concentration of a dopant, such as an impurities species from Group V of the Periodic Table, such as phosphorus (P) or arsenic (As), effective to impart n-type conductivity.

The device structure 25 features a vertical architecture in which the collector 16, the single crystal section 28 of the intrinsic base layer 26, and the emitter 40 are vertically arranged. The conductivity type of the semiconductor material constituting the intrinsic base layer 26 is opposite to the conductivity type of the semiconductor materials constituting the emitter 40 and the collector 16. The device structure 25 may be characterized as a heterojunction bipolar transistor if two or all three of the collector 16, the intrinsic base layer 26, and the emitter 40 are comprised of different semiconductor materials. An emitter-base junction 48 is defined at the interface between the emitter 40 and the intrinsic base layer 26. The extrinsic base layer 34 is raised relative to the emitter-base junction 48 and, in particular, a top surface 34a of the extrinsic base layer 34 is contained in a plane that is above a plane containing the emitter-base junction 48. A base-collector junction is defined at the interface between the collector 16 and the intrinsic base layer 26. The device structure 25 can be divided into an intrinsic device region coinciding with the portions of the collector 16, the intrinsic base layer 26, and the emitter 40 participating in the junctions and an extrinsic device region outside of the intrinsic device region.

The protect layer 20 and any overlying layers may be removed in the regions surrounding the device structure 25 in order to complete the fabrication of the CMOS transistors in those regions. Middle-of-line (MOL) processing and back-end-of-line (BEOL) processing follows, which includes silicidation, formation of dielectric layers, via plugs, and wiring for an interconnect structure coupled by the local interconnect structure with the bipolar junction transistor, as well as other similar contacts for additional device structures like device structure 25 and CMOS transistors included in other circuitry fabricated on the substrate 10.

The proximity of the protect layer 20 to the intrinsic device region, and the emitter opening and the emitter 40 in particular, through the selection of the size and location of the opening 22 may be effective to influence the performance of the device structure 25. Locating the edges 24 of the opening 22 at a location over the top surface of the device region 14 relocates the polycrystalline semiconductor material of base layers 26, 34 to have greater proximity to the intrinsic device region. Compressive stress is transferred from the protect layer 20 to the intrinsic device region. Among other effects, the transferred stress may be effective to increase the diffusion of dopant (e.g., n-type dopant) from the emitter 40 to the underlying intrinsic base of the intrinsic base layer 26, which has an opposite conductivity type.

Figure 7:
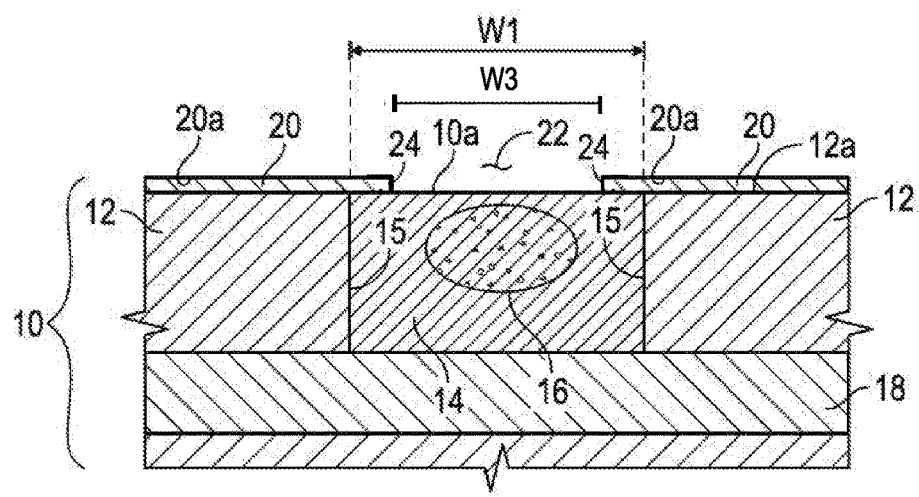
FIG. 7 is a cross-sectional view similar to FIG. 1B in which the opening in the protect layer is narrowed in width.

The magnitude of the compressive stress applied to the intrinsic device region can be varied for different device structures by varying the width of the opening 22. The ability to vary the compressive stress may permit the diffusivity of the dopant contained in the emitter 40 to be manipulated as a variable. As a result, the emitter-base junction may be independently controlled such that peak cutoff frequency and the transistor gain can be controlled for devices of otherwise the same dimensions fabricated on the same substrate. For example, device structures 25 characterized by openings 22 of different widths (see, e.g., FIG. 7) each smaller than the width of the device region 14 may be fabricated using different device regions on the same substrate. Due to the variation in the opening width, the different device structures may have different performance characteristics, such as peak cutoff frequency and transistor gain.

The intervening presence of the protect layer 20 between the base layers 26, 34 and the device region 14 may also be effective to reduce the concentration of dopant (e.g., p-type dopant) at the device periphery available for diffusion from the base layers 26, 34 to the device region 14, which has an opposite conductivity type from the base layers 26, 34. The semiconductor material of the protect layer 20 may be doped with the same dopant as the intrinsic base layer 26 and the extrinsic base layer 34. However, the dopant concentration in the protect layer 20 may be lower than the dopant concentration in either the intrinsic base layer 26 or the extrinsic base layer 34. Consequently, the protect layer 20 contains less dopant than contributes to diffusion during thermal cycles, and operates as a buffer zone of semiconductor material of relative low dopant concentration between semiconductor material containing a relatively high dopant concentration and the device region 14.

Multiple device structures were fabricated and tested in which the baseline device structure was a 0.1×2.0 $\mu m^2$ SiGe heterojunction bipolar transistor designed to operate at a peak cutoff frequency of 300 and a maximum frequency of 360 GHz as nominal figures of merit. The device construction was similar to the device constructions for device structures shown and discussed herein. The size of the opening in the protect layer was varied and the effects on device performance measured as a function of the opening dimensions.

The device AC performance was extracted using two port S-parameter measurements with standard Load-Reflect-Reflect-Match (LRRM) calibration and open and short de-embedding to remove parasitic impedances associated with measurement cables, probes, wiring and pads.

Figure 3:
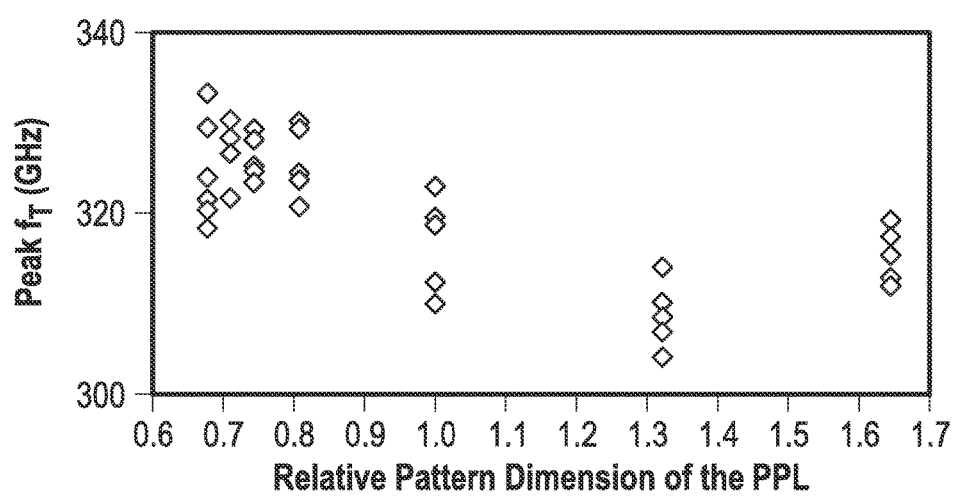
FIG. 3 is a graph plotting peak cutoff frequency as a function of relative pattern dimension for the opening in the protect layer.

FIG. 3 is a graph plotting peak cutoff frequency for the device structure as a function of relative pattern dimension for the opening in the protect layer. The peak cutoff frequency exhibits a sensitivity to the layout of the protect layer. As the width of the opening in the protect layer is reduced, the peak cutoff frequency does not exhibit a significant change with decreasing dimensions of the opening until a minimum dimension at which the dimensions (length and width) of the opening are equal to the dimensions (length and width) of the device region. In other words, the open area of the opening is equal to the surface area of the device region (i.e., a relative pattern dimension equal to unity or 1) when the peak cutoff frequency begins to increase in comparison with the peak cutoff frequency for an open area of the opening being greater than the surface area of the device region (e.g., a relative pattern dimension equal to 1.35). The peak cutoff frequency at relative pattern dimensions increases as the dimensions (e.g., length and width) of the opening are reduced (i.e., relative pattern dimensions between 0.65 and 0.8). The improvement in peak cutoff frequency at relative pattern dimensions between 0.65 and 0.8 is observed to be on the order of 20 GHz over that of the nominal device. A relative pattern dimension of 0.65 represents a limitation on the reduction in opening size imposed by lithography limits.

Figure 4:
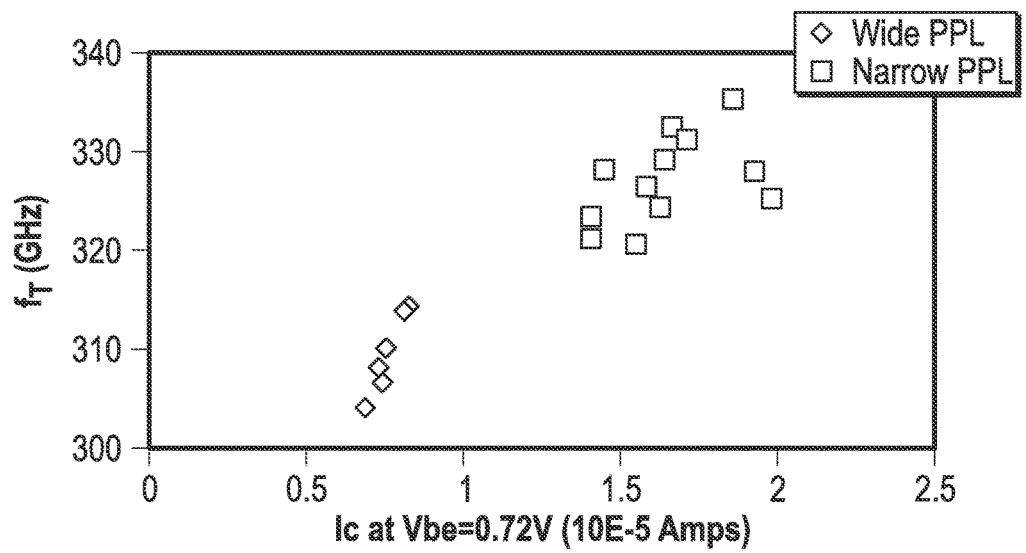
FIG. 4 is a graph plotting peak threshold frequency as a function of the relative pattern dimension for the opening in the protect layer.

FIG. 4 is a graph plotting peak threshold frequency as a function of collector current for different pattern dimensions for the opening in the protect layer. Devices with an opening having a relative pattern dimension in a range between 0.65 and 1 exhibit a collector current with the base-emitter junction biased at 0.72 volts that is greater than the collector current with the base-emitter junction biased at 0.72 volts for devices with an opening having a relative pattern dimension greater than 1. The increase in peak cutoff frequency is also apparent in FIG. 4 for devices having a relative pattern dimension less than or equal to 1.

Figure 5:
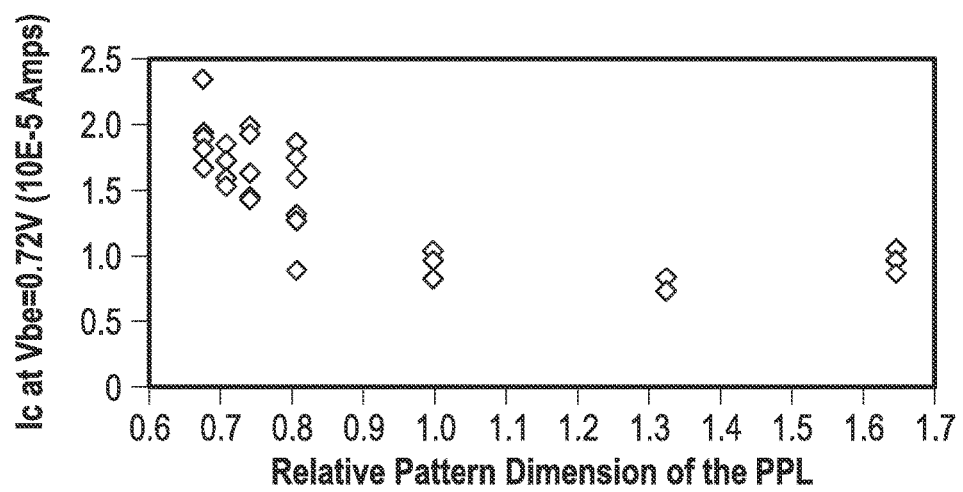
FIG. 5 is a graph plotting collector current as a function of the relative pattern dimension for the opening in the protect layer.

FIG. 5 is a graph plotting collector current with the base-emitter junction biased at 0.72 volts as a function of the relative pattern dimension for the opening in the protect layer. The collector current is observed to increase with decreasing relative pattern dimension, and is greatest for relative pattern dimensions of 1 or less.

Figure 6:
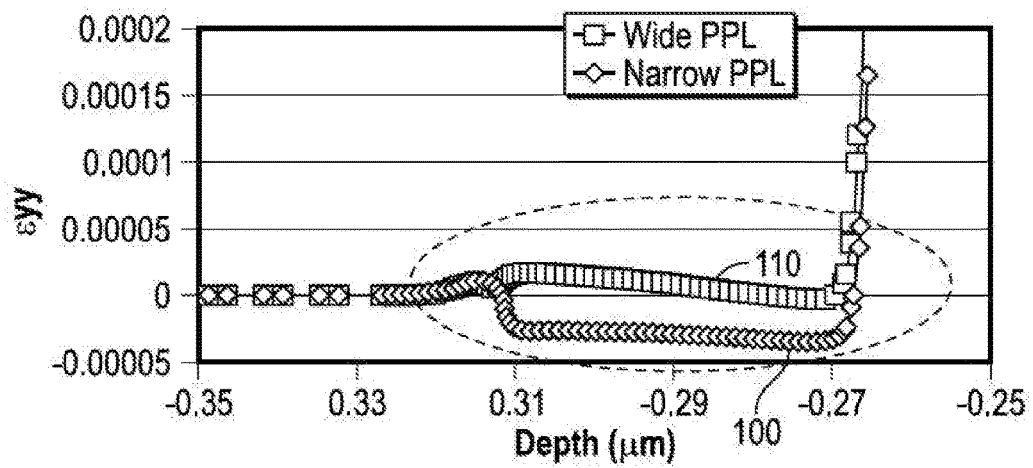
FIG. 6 is a graph plotting lateral strain as a function of position along a centerline of the device structure for an opening in the protect layer with a width less than the width of the device region.

FIG. 6 is a graph plotting lateral strain as a function of position along a centerline of the device for an opening in the protect layer with a width less than the width of the device region (Narrow PPL). For comparison, the lateral strain for an analogous device structure with an opening in the protect layer having with a width greater than the width of the device region (Wide PPL) is also shown. The graph was generated using Technology Computer-Aided Design (TCAD) computer simulations of devices that were tested.

For a device having an opening in the protect layer with a relative pattern dimension of less than 1, compressive stress is observed in a region immediately below the emitter interface (i.e., at −0.31 in the plot) as indicted by curve 100 (Narrow PPL). In contrast, for a device having an opening in the protect layer with a relative pattern dimension greater than 1, tensile stress is observed in the same region as indicted by curve 110 (Wide PPL). Consequently, the compressive stress observed for comparatively narrow opening dimensions is opposite to the tensile stress observed for comparatively wide opening dimensions. The compressive stress is directed inward toward the intrinsic device and the emitter of the device structure.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
   forming one or more trench isolation regions in a substrate to define a first device region having a first width;
   forming a protect layer on a top surface of the one or more trench isolation regions;
   forming a first opening in the protect layer that coincides with a top surface of the device region and that has a second width that is less than or equal to the first width of the first device region; and
   forming a base layer of a first bipolar junction transistor having a first section on the first device region inside the first opening and a second section on the protect layer,
   wherein the first section of the base layer is comprised of single crystal semiconductor material, and the protect layer and the second section of the base layer are comprised of polycrystalline semiconductor material.

2. The method of claim 1 wherein the second width of the first opening in the protect layer is less than the first width of the first device region.

3. The method of claim 1 wherein the second width of the first opening in the protect layer is equal to the first width of the first device region.

4. The method of claim 1 wherein an edge of the first opening in the protect layer is located at or inside an edge of the one or more trench isolation regions.

5. The method of claim 1 wherein the protection layer is further formed on a portion of the top surface of the device region, and the protect layer and the second section of the base layer partially cover the top surface of the device region.

6. The method of claim 1 further comprising:
   forming an emitter on the base layer,
   wherein the emitter has a third width parallel to the first width and the second width, and a top surface of the base layer is contained in a first plane that is raised above a second plane containing a junction between the emitter and the base layer.

7. The method of claim 6 wherein the second section of the base layer is configured to exert a compressive stress on the emitter and the junction between the emitter and the base layer that increases dopant diffusion from the emitter into the base layer.

8. The method of claim 1 wherein the protect layer is located between the base layer and the first device region, and the protect layer includes a first dopant concentration that is less than a second dopant concentration of the base layer.

9. The method of claim 1 further comprising:
   forming a second opening in the protect layer that is aligned with the top surface of a second device region,
   wherein the second opening has a third width that is less than the second width of the first opening, and a second bipolar junction transistor formed using the second device region has a different peak cutoff frequency or transistor gain than the first bipolar junction transistor formed using the first device region.

10. A device structure comprising:
   one or more trench isolation regions in a substrate, the one or more trench isolation regions defining a first device region in the substrate, and the first device region having a top surface and a first width;
   a protect layer on the top surface of the one or more trench isolation regions and the top surface of the first device region, the protect layer including a first opening that coincides with the top surface of the device region, and the first opening having a second width that is less than or equal to the first width of the first device region; and
   a base layer of a first bipolar junction transistor having a first section on the first device region inside the first opening and a second section on the protect layer, the first section of the base layer is comprised of single crystal semiconductor material, wherein the protect layer and the second section of the base layer are comprised of polycrystalline semiconductor material.

11. The device structure of claim 10 wherein the second width of the first opening in the protect layer is less than the first width of the first device region.

12. The device structure of claim 10 wherein the second width of the first opening in the protect layer is equal to the first width of the first device region.

13. The device structure of claim 10 wherein the one or more trench isolation regions have an edge at an interface with the device region, and the first opening in the protect layer has an edge that is located at or inside the edge of the one or more trench isolation regions.

14. The device structure of claim 10 wherein the protection layer is further formed on a portion of the top surface of the device region, and the protect layer and the second section of the base layer partially cover the top surface of the device region.

15. The device structure of claim 10 further comprising:
an emitter on the base layer, the emitter having a third width parallel to the first width and the second width,
wherein the base layer has a top surface that is contained in a first plane that is raised above a second plane containing a junction between the emitter and the base layer.

16. The device structure of claim 15 wherein the second section of the base layer is configured to exert a compressive stress on the emitter and the junction between the emitter and the base layer that reduces dopant diffusion from the emitter into the base layer.

17. The device structure of claim 10 wherein the protect layer is located between the base layer and the first device region, and the protect layer includes a first dopant concentration that is less than a second dopant concentration of the base layer.

18. The device structure of claim 10 further comprising:
a second device region having a top surface; and
a second opening in the protect layer that coincides with the top surface of the second device region,
wherein the second opening has a third width that is less than the second width of the first opening, and a second bipolar junction transistor formed using the second device region has a different peak cutoff frequency or transistor gain than the first bipolar junction transistor formed using the first device region.

19. The device structure of claim 10 wherein the protect layer is removed from areas of the substrate outside of the first device region.

* * * * *